US007999533B2

(12) United States Patent
LaCroix

(10) Patent No.: US 7,999,533 B2
(45) Date of Patent: Aug. 16, 2011

(54) MAGNETIC SENSOR WITH COMPENSATION

(75) Inventor: Mark E. LaCroix, Winchester, NH (US)

(73) Assignee: Timken US Corporation, Canton, OH (US)

(*) Notice: Subject to any disclaimer, the term of this patent is extended or adjusted under 35 U.S.C. 154(b) by 686 days.

(21) Appl. No.: 12/097,301

(22) PCT Filed: Jan. 12, 2007

(86) PCT No.: PCT/US2007/000887
§ 371 (c)(1),
(2), (4) Date: Jun. 13, 2008

(87) PCT Pub. No.: WO2007/087179
PCT Pub. Date: Aug. 2, 2007

(65) Prior Publication Data
US 2008/0290859 A1     Nov. 27, 2008

Related U.S. Application Data

(60) Provisional application No. 60/758,315, filed on Jan. 12, 2006.

(51) Int. Cl.
*G01B 7/14* (2006.01)
(52) U.S. Cl. ............ 324/207.12; 324/207.2; 324/207.24
(58) Field of Classification Search ............... 324/207.21
See application file for complete search history.

(56) References Cited

U.S. PATENT DOCUMENTS

| 6,307,365 | B1 | 10/2001 | Santos et al. |
| 6,573,710 | B1 | 6/2003 | Santos et al. |
| 2002/0145419 | A1* | 10/2002 | Luetzow et al. ......... 324/207.12 |

FOREIGN PATENT DOCUMENTS

WO    WO 9953266    10/1999

OTHER PUBLICATIONS

Search Report and Written Opinion from corresponding International Application No. PCT/US2007/000887 mailed on Dec. 11, 2007.

* cited by examiner

*Primary Examiner* — Jay Patidar
(74) *Attorney, Agent, or Firm* — Michael Best & Friedrich LLP

(57) ABSTRACT

A sensing assembly. The sensing assembly is spaced apart from a magnet that has a magnet length, and includes a compensation module and a string of magnetic sensors that has a string length. The magnetic sensors are grouped into a plurality of magnetic sensor groups. Each of the magnetic sensors generates a respective intermediate signal based on the magnet. The compensation module assigns a plurality of respective gains to the respective magnetic sensor groups based on a difference between the magnet length and the string length, and applies the respective gains to the respective intermediate signals of the respective magnetic sensor groups to generate respective adjusted signals.

21 Claims, 9 Drawing Sheets

MAGNETIC SENSOR WITH COMPENSATION

RELATED APPLICATION

This application claims the benefit of U.S. Provisional Application Ser. No. 60/758,315, filed on Jan. 12, 2006, the entire content of which is incorporated by reference herein.

FIELD

Embodiments of the invention relate generally to magnetic sensors, and particularly to magnetic string sensors.

BACKGROUND

When a string of sensors or string sensors are positioned in a magnetic field generated by a multi-pole magnet, the sensors generate sine and cosine signals due to the magnetic field. The sine and cosine signals can then be used to detect positional information of the sensors. Particularly, the sensors are first divided into a plurality of sections of sensors, and outputs of the sections of sensors are summed and subtracted from each other to form the sine and cosine signals.

The sine and cosine signals formed from the outputs of the sensors are affected by other processes and parameters. For example, amplitudes of the sine and cosine signals will be mismatched if lengths of the multi-pole magnet and the sensor string are improperly matched. Additionally, the amplitudes of the sine and cosine signals have to be matched before the sine and cosine signals are interpolated. Typically, the amplitudes of the sine and cosine signals are matched by attenuating or amplifying the outputs of the sections of sensors by a gain factor such that the amplitudes of the sine and cosine signals are equal or normalized.

SUMMARY

When the length of a string sensor is improperly matched to the length of a multi-pole magnet, compensation processes can be used to equalize amplitudes of the sine and cosine signals. For example, a two-channel compensation process that compensates both the sine and cosine signals equalizes the amplitudes of the sine and cosine signals. Particularly, the two-channel compensation process compensates the sine and cosine signals by attenuating and amplifying the outputs of the sensors. The two-channel compensation process also utilizes even step sizes of gain factors between adjustments. Additionally, a single-channel compensation process that compensates only a single output signal generally utilizes even step sizes. However, noise can be introduced during the single-channel compensation process resulting in inaccurate output waveforms.

Embodiments of the invention relate to methods and systems to properly match or equalize output amplitudes of a plurality of string sensors. In one form, the invention provides a sensing assembly spaced apart from a magnet that has a magnet length. The sensing assembly includes a string of magnetic sensors and a compensation module. The string of magnetic sensors has a string length. The magnetic sensors are grouped into a plurality of magnetic sensor groups. Each of the magnetic sensors generates a respective intermediate signal based on the magnet. The compensation module assigns a plurality of respective gains to the respective magnetic sensor groups based on a difference between the magnet length and the string length, and applies the respective gains to the respective intermediate signals of the respective magnetic sensor groups to generate respective adjusted signals.

In another form, the invention provides a method of compensating for a dimensional difference between a magnet and a sensor string having a plurality of sensors. The method includes assigning a reference to the magnet, determining a respective distance between each of the sensors and the reference, and assigning a respective weight to each of the sensors based on the respective distance. The method also includes applying the assigned respective weights to respective outputs of the sensors.

In yet another form, the invention provides a method of compensating for a dimensional difference between a magnet and an adjacent sensor string having a plurality of sensors. The method includes measuring the dimensional difference between the magnet and the sensor string, and grouping the sensors into a plurality of sensor groups. The method also includes generating a respective intermediate signal at each of the sensors based on the magnet, and applying a gain to the respective intermediate signals based on the dimensional difference and the groups.

Embodiments herein can generate outputs that have essentially symmetric amplitudes while keeping essentially same group gains during a compensation process. Particularly, the compensation process can produce in a number of sections of sensors essentially equal and essentially opposite amounts of compensation. Outputs of the sensors are adjusted with a group gain to form sine and cosine signals. The compensation process also maximizes an accuracy of the sine and cosine signals while reducing a noise level of the sine and cosine signals. Additionally, since the compensation process utilizes the same group gain for the sensors in a group, embodiments can utilize a reduced or minimized number of components. Furthermore, errors or noise introduced during the compensation process can be canceled, reduced, or minimized by distributing the gain factor over the string of sensors.

Other aspects of the invention will become apparent by consideration of the detailed description and accompanying drawings.

DETAILED DESCRIPTION

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless specified or limited otherwise, the terms "mounted," "connected," "supported," and "coupled" and variations thereof are used broadly and encompass both direct and indirect mountings, connections, supports, and couplings. Further, "connected" and "coupled" are not restricted to physical or mechanical connections or couplings.

Embodiments of the invention relate to a method of generating a high resolution signal with a sensing assembly. In some embodiments, the sensing apparatus has a string of sensors and a multi-pole magnet that have different lengths. The method includes separating or dividing outputs of the string of sensors into different groups of sensors, and determining a dimensional parameter of each of the groups. The method also includes determining a gain value, factor, or weight for each of the groups based on the respective dimensional parameter. The method also includes compensating the outputs of each of the groups with the gain factor. In a specific embodiment, determining a dimensional parameter of each of the groups includes determining a distance difference between each of the groups and the multi-pole magnet.

Embodiments of the invention also provide a sensor apparatus including a string of sensors and a multi-pole magnet. In some embodiments, the string of sensors and the multi-pole magnet have different lengths. The multi-pole magnet generates a magnetic field with respect to poles of the multi-pole magnet. The magnetic field surrounds each of the string sensors at a different position relative to the poles of the multi-pole magnet. As a result, the string sensors generate essentially different outputs due to the multi-pole magnet. The sensor apparatus also includes a compensation module that compensates the outputs of the string sensors such that amplitudes of the outputs are equalized.

Figure 1:
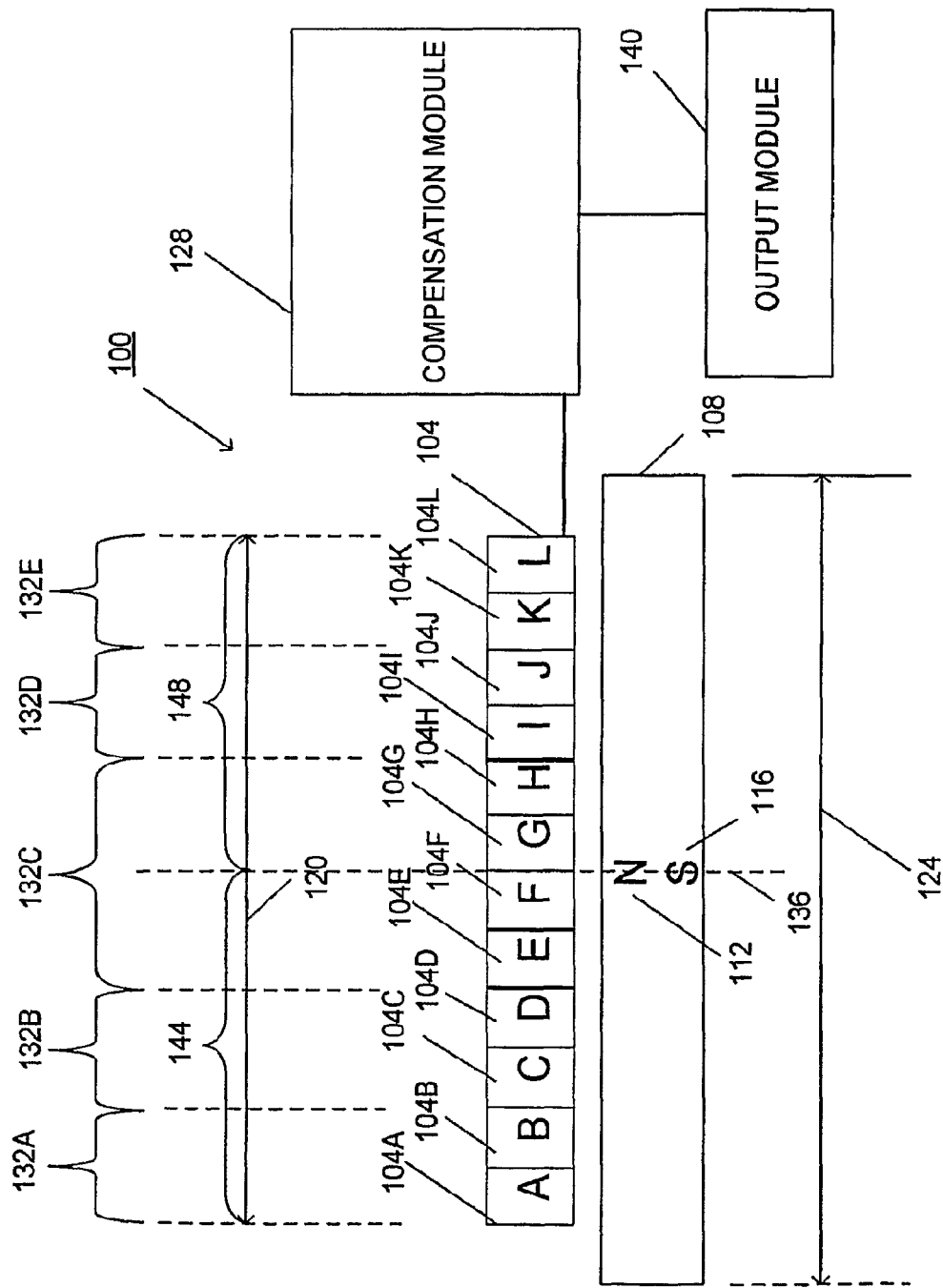
FIG. 1 is a schematic view of a sensing apparatus having a string of sensors and a multi-pole magnet.

FIG. 1 shows a schematic view of a sensing apparatus 100 having a string of sensors 104A, 104B, 104C, 104D, 104E, 104F, 104G, 104H, 104I, 104J, 104K, and 104L, which are collectively referred to herein as sensors, the string sensor, or the string of sensors 104. Although the string sensor 104 includes a total of 12 individual sensors, the sensing apparatus 100 can have any other number of sensors in the string sensor 104. In some embodiments, the sensors 104 are Hall sensors or devices, other magnetic sensors, or a combination thereof. The sensing apparatus 100 also includes a multi-pole magnet 108 that generates a magnetic field around first and second poles 112, 116. Each of the sensors 104 reacts to the magnetic field and generates an output based on strength and direction of the magnetic field detected by a respective sensor 104. Although the first pole 112 and the second pole 116 are shown as being a North Pole and a South Pole of the multi-pole magnet 108, respectively, the first pole 112 and the second pole 116 can also be a South Pole and a North Pole, respectively.

FIG. 1 also shows that the string of sensors 104 has a different length than that of the multi-pole magnet 108. Particularly, the string of sensors 104 has a collective sensor length 120 whereas the multi-pole magnet 108 has a pole spacing or magnet length 124. Although the sensors 104 are arranged relatively symmetrically with respect to the first and second poles 112, 116, the sensors 104 can also be relatively asymmetric with respect to the first and second poles 112, 116. In such cases, the sensing apparatus 100 compensates for the asymmetric difference by dividing the sensor length 120 into two portions with respect to the first and second poles 112, 116, as detailed below.

The sensing apparatus 100 also includes a compensation module 128 to store both the magnet length 124 and the sensor length 120, to collect the outputs of each of the sensors 104, to process the outputs of each of the sensors 104, and to generate an output of the sensing apparatus 100. The compensation module 128 performs processes that may be carried out by software and/or hardware. Furthermore, the processes carried out by the compensation module 128 and other modules are capable of being implemented in software executed by a microprocessor or a similar device or of being implemented in hardware using a variety of components including, for example, application specific integrated circuits ("ASICs"). In the embodiment shown in FIG. 1, the compensation module 128 groups or divides the sensors 104 into groups of sensors or sensor groups 132A, 132B, 132C, 132D, and 132E collectively referred to as groups 132. Particularly, the sensor group 132A includes the sensors 104A, 104B, the sensor group 132B includes the sensors 104C, 104D, the sensor group 132C includes the sensors 104E, 104F, 104G, 104H, the sensor group 132D includes the sensors 104I, 104J, and the sensor group 132E includes the sensors 104K, 104L, respectively. Although the embodiment shown in FIG. 1 includes five sensor groups, the compensation module 128 can also group different number of sensors into different number of sensor groups in other embodiments.

The compensation module 128 also measures a distance between each of the sensors 104 and a reference point on the multi-pole magnet 108 for the sensors 104. An exemplary reference point on the multi-pole magnet 108 is the first pole 112. In some embodiments, the distance is a perpendicular or a normal distance between a sensor 104 and a pole line 136 formed by joining the first and second poles 112, 116. In other embodiments, the distance is defined as a minimum distance between the sensor 104 and one of the first and second poles 112, 116. Alternatively, the distance is defined as a minimum distance or a normal distance between a group of sensors and one of the first and second poles 112, 116. In yet other embodiments, the distance can be measured or determined by other known techniques.

In the embodiment shown in FIG. 1, the compensation module 128 determines a weight or gain factor for each of the groups 132 based on the distance from the pole line 136. In some embodiments, the compensation module 128 determines the gain factor from a gain function that relates the distances to a set of predetermined gain factors and a length offset that defines a difference between the sensor length 120 and the magnet length 124. For example, the gain function can be a linear gain function that assigns a maximum gain factor when the distance between the respective group and the pole line 136 is maximum, and a minimum gain factor when the distance between the respective group and the pole line 136 is minimum. In such cases, the gain factors for the other groups are then linearly interpolated. In some cases, the minimum gain factor has an equal but opposite-signed value as the maximum gain factor. Other types of gain functions, such as non-linear functions and special step functions, can also be used such that amplitudes of the outputs of the sensors are equal.

In the embodiment shown in FIG. 1, after the compensation module 128 has divided the sensors 104 into five groups 132, each of the groups 132 is assigned a weight as follows. The sensors 104A, 104B of the outer sensor group 132A are assigned a first gain factor with a value of X, the sensors 104C, 104D of the center sensor group 132B are assigned a second gain factor of a value of unity, and the sensors 104E, 104F, 104G, 104H of the inner sensor group 132C are assigned a third gain factor of a value of −X, respectively. Similarly, the sensors 104K, 104L of the second outer sensor group 132E are assigned the first gain factor, and the sensors 104I, 104J of the second center sensor group 132D are assigned the second gain factor, respectively. That is, outputs of the sensors 104A, 104B of the outer sensor group 132A and outputs of the sensors 104K, 104L of the second outer sensor group 132E are amplified for longer magnetic poles. Similarly, outputs of the sensors 104C, 104D of the center sensor group 132B and outputs of the sensors 104I, 104J of the second center sensor group 132D remain the same, while outputs of the sensors 104E, 104F, 104G, 104H of the inner sensor group 132C are attenuated. Although the sensors 104E, 104F, 104G, 104H of the inner sensor group 132C are assigned the third gain factor with a negative value, the sensors 104E, 104F, 104G, 104H of the inner sensor group 132C can also be assigned another positive gain factor that satisfies the linear gain function. The compensation module 128 then sends the compensated outputs of the sensors 104 to an output module 140 (e.g. a controller). Although the compensation module 128 and the output module 140 are shown in FIG. 1 as separate modules, the compensation module 128 and the output module 140 can also be included in a single module.

In a case where the sensors 104 are relatively asymmetric with respect to the first and second poles 112, 116, the compensation module 128 divides the sensors 104 into first and second longitudinal portions. For example, the first longitudinal portion consists of the sensors 104A, 104B, 104C, 104D, 104E, 104F, which has a first collective portion length. Similarly, the second longitudinal portion consists of the sensors 104G, 104H, 104I, 104J, 104K, 104L, which has a second collective portion length. The compensation module 128 then applies a second gain function based on the first collective portion length, and a third gain function based on the second collective portion length. The compensation module 128 then assigns gain factors to the sensors 104 depending on the second and third gain functions. In some embodiments, the gain functions are preprogrammed into the apparatus 100. In other embodiments, the gain functions are determined periodically or on-demand such that the gain functions are adjusted over time.

In some embodiments, to equalize amplitudes of the sine and cosine signals, the compensation module 128 requires a specific amount of amplification or attenuation for a particular group of the string based on an amount of pole spacing or length mismatch. Particularly, if the magnet length 124 and the sensor length 120 differ by an amount, a corresponding amplitude difference between the sine and cosine signals is predetermined due to the amount and is stored in the compensation module 128 in order to generate a respective gain factor. For example, if the magnet length 124 and the sensor length 120 differ by about 20 percent, there may be a difference of about ±8.2 percent between the amplitudes of the sine and the cosine signals when a total of 12 sensors 104 are used in a single-ended string configuration. The compensation module 128 then develops or generates a respective amplification or attenuation factor due to the difference. For example, when a difference of 8.2 percent has been determined for 12 sensors for use in a single-ended string configuration, an amplification factor of about 11 percent (+11 percent) or an attenuation factor of about 11 percent (−11 percent) can be used. In such cases, the gain factors are then ±1.11.

After the outputs of the sensors 104 have been adjusted or compensated, the output module 140 then generates compensated output signals in the form of sine and cosine waves by adding and subtracting outputs of different sections of the string sensor 104. For example, the output module 140 groups the sensors 104 into first and second sections 144, 148. The first compensated section 144 then includes the sensors 104A, 1043, 104C, 104D, 104E, 104F, whereas the second compensated section 148 includes the sensors 104G, 104H, 104I, 104J, 104K, 104L. The output module 140 then adds the outputs of the first compensated section 144 to the outputs of the second compensated section 148 to obtain the sine signals in a known manner. Similarly, the output module 140 subtracts the outputs of the second compensated section 148 from the outputs of the first compensated section 144 to obtain the cosine signals in a known manner. In one embodiment, sensors are first grouped into groups for purposes of gain compensation. Then, sensors are divided into sections for purposes of equalizing amplitudes of sine and cosine signals. Particularly, FIG. 1 shows that the sensors 104 are grouped or divided into five groups 132 and into two sections 144, 148. Each of the groups 132 is assigned a respective gain factor. The outputs of each of the sections 144, 148 are summed with and subtracted from each other to obtain equalized amplitudes of sine and cosine signals. The terms "group" and "section" are used herein merely to facilitate discussion of various grouping processes and can be used interchangeably.

Figure 1A:
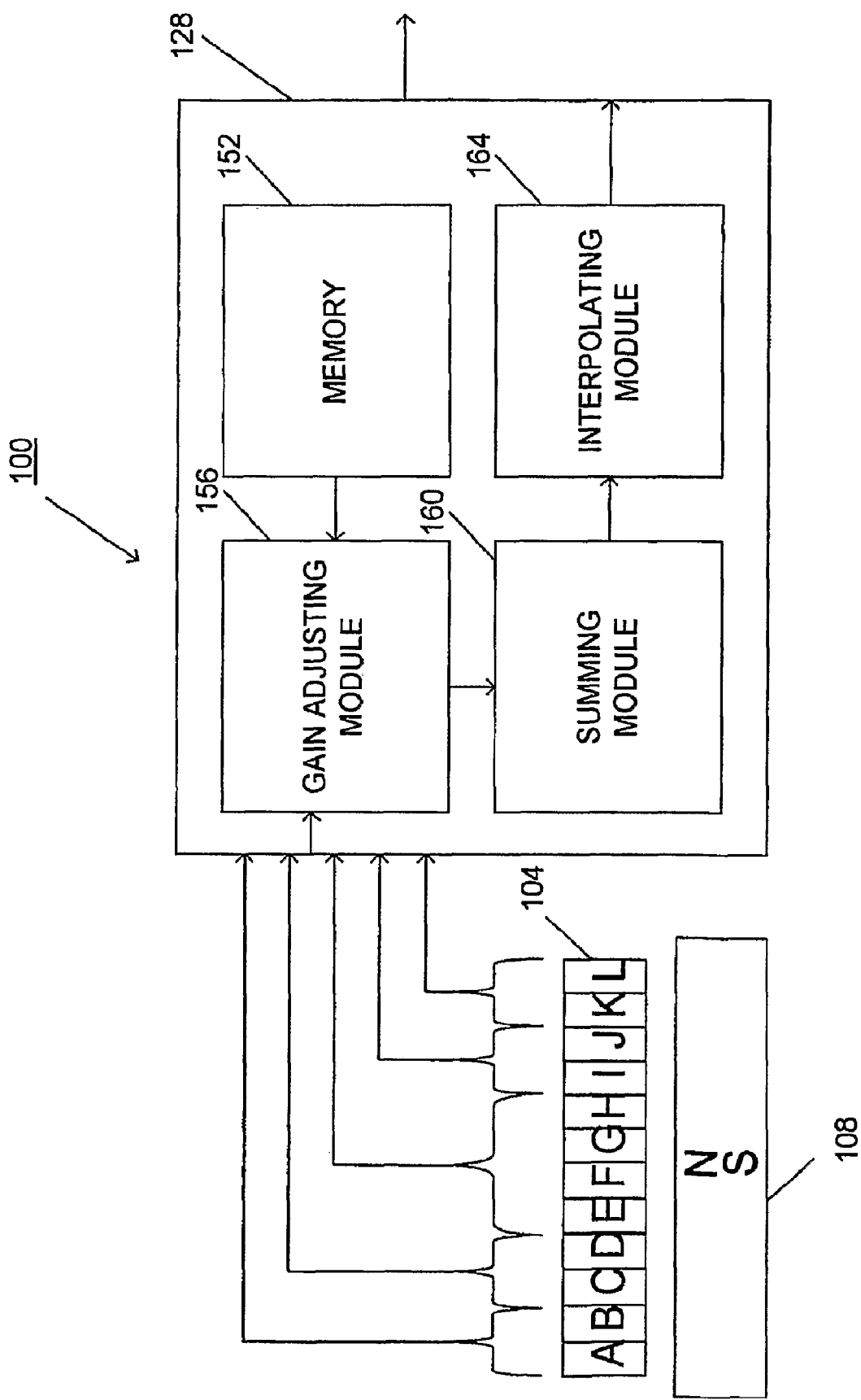
FIG. 1A is a detailed schematic view of the sensing apparatus of FIG. 1.

FIG. 1A shows a detailed embodiment of the compensation module 128 of FIG. 1. The compensation module 128 includes a memory module 152 that stores a plurality of group gains predetermined based on a difference in length between the magnet 108 and the sensor string 104. A gain-adjusting module 156 then adjusts outputs of the magnetic sensors 104 based on the group in which the sensors have been assigned to obtain a plurality of adjusted signals as discussed earlier. A summing module 160 adds and subtracts the adjusted signals based on the group to obtain a plurality of output signals in the form of sine and cosine functions. An interpolating module 164 converts the output signals, which are generally analog signals in some embodiments, into a plurality of digital signals.

Figure 2:
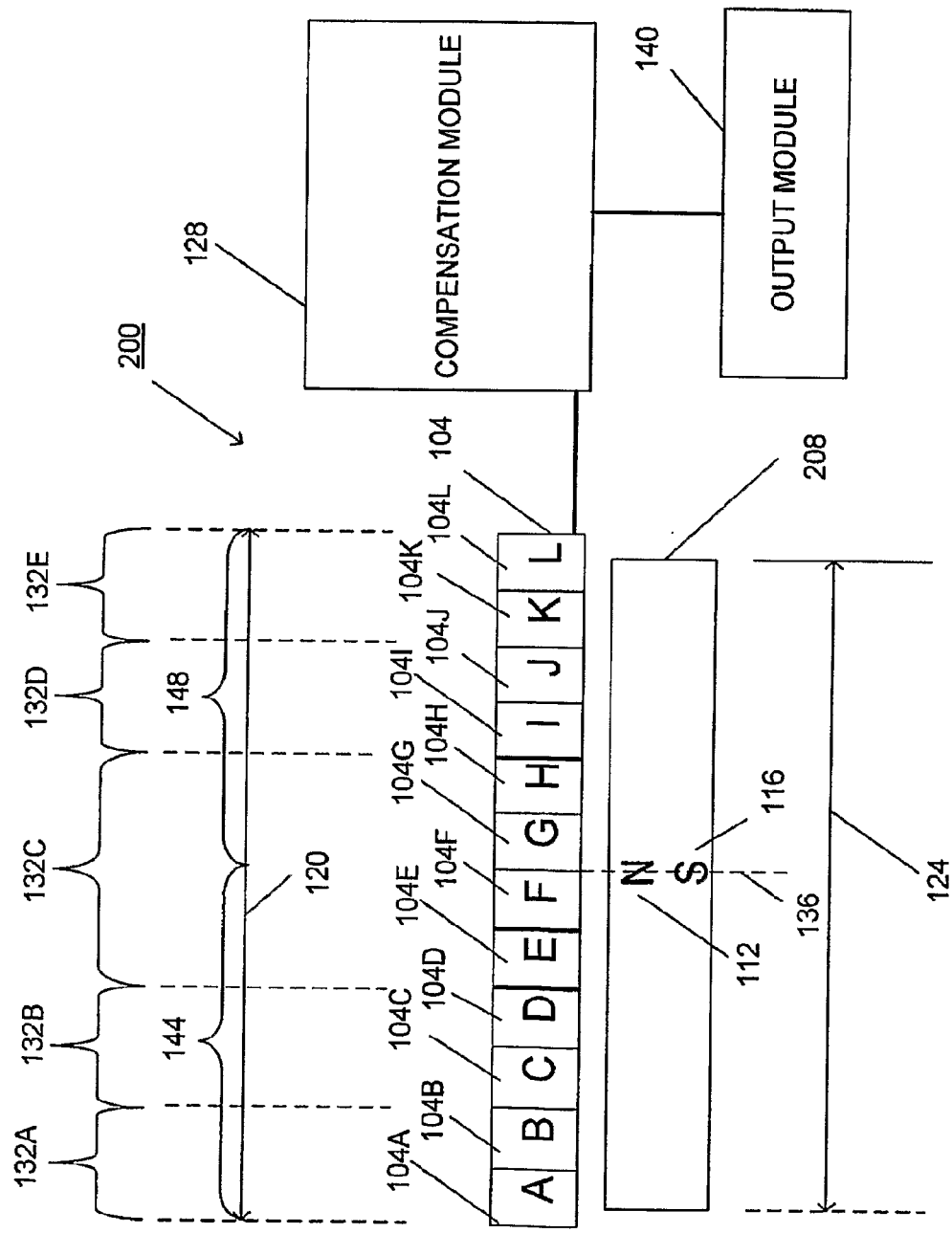
FIG. 2 is a schematic view of a second sensing apparatus.

FIG. 2 shows a schematic view of a second sensing apparatus 200 having the string of sensors 104 positioned near a multi-pole magnet 208 that has a magnet length 212, wherein like reference numerals are used to refer to like parts. In the embodiment shown, the sensor length 120 is less than the magnet length 212. Similar to the embodiments shown in FIG. 1, the compensation module 128 divides the string of sensors 104 into five groups 132, generates a fourth gain function, and assigns a gain factor to each of the groups 132. Particularly, the fourth gain function attenuates the groups 132 that are furthest from the pole line 136, and amplifies the groups 132 that are closest to the pole line 136. For example, after the compensation module 128 has divided the sensors 104 into five groups 132, each of the groups 132 is assigned a value as follows. The sensors 104A, 104B of the outer sensor group 132A are assigned the third gain factor with the value of −X, the sensors 104C, 104D of the center sensor group 132B are assigned the second gain factor of the value of unity, and the sensors 104E, 104F, 104G, 104H of the inner sensor group 132C are assigned the first gain factor of a value of X, respectively. Similarly, the sensors 104K, 104L of the second outer sensor group 132E are assigned the third gain factor, and the sensors 104I, 104J of the second center sensor group 132D are assigned the second gain factor, respectively. That is, outputs of the sensors 104A, 104B of the outer sensor group 132A and the sensors 104K, 104L of the second outer sensor group 132E are attenuated for shorter magnetic poles.

Similarly, outputs of the sensors 104C, 104D of the center sensor group 132B and the sensors 104I, 104J of the second center sensor group 132D remain the same, while outputs of the sensors 104E, 104F, 104G, 104H of the inner sensor group 132C are amplified. Although the sensors 104E, 104F, 104G, 104H of the inner sensor group 132C are assigned the first gain factor with a positive value, the sensors 104E, 104F, 104G, 104H of the inner sensor group 132C can also be assigned another negative gain factor that satisfies the fourth gain function.

The output module 140 then generates compensated output signals in the form of sine and cosine waves by adding and subtracting outputs of different sections of the string sensor 104. For example, the output module 140 again groups the sensors 104 into the first and second sections 144, 148 as described. The output module 140 then adds the outputs of the first compensated section 144 to the outputs of the second compensated section 148 to obtain the sine signals in a known manner. Similarly, the output module 140 subtracts the outputs of the second compensated section 148 from the outputs of the first compensated section 144 to obtain the cosine signals in a known manner.

Figure 3:
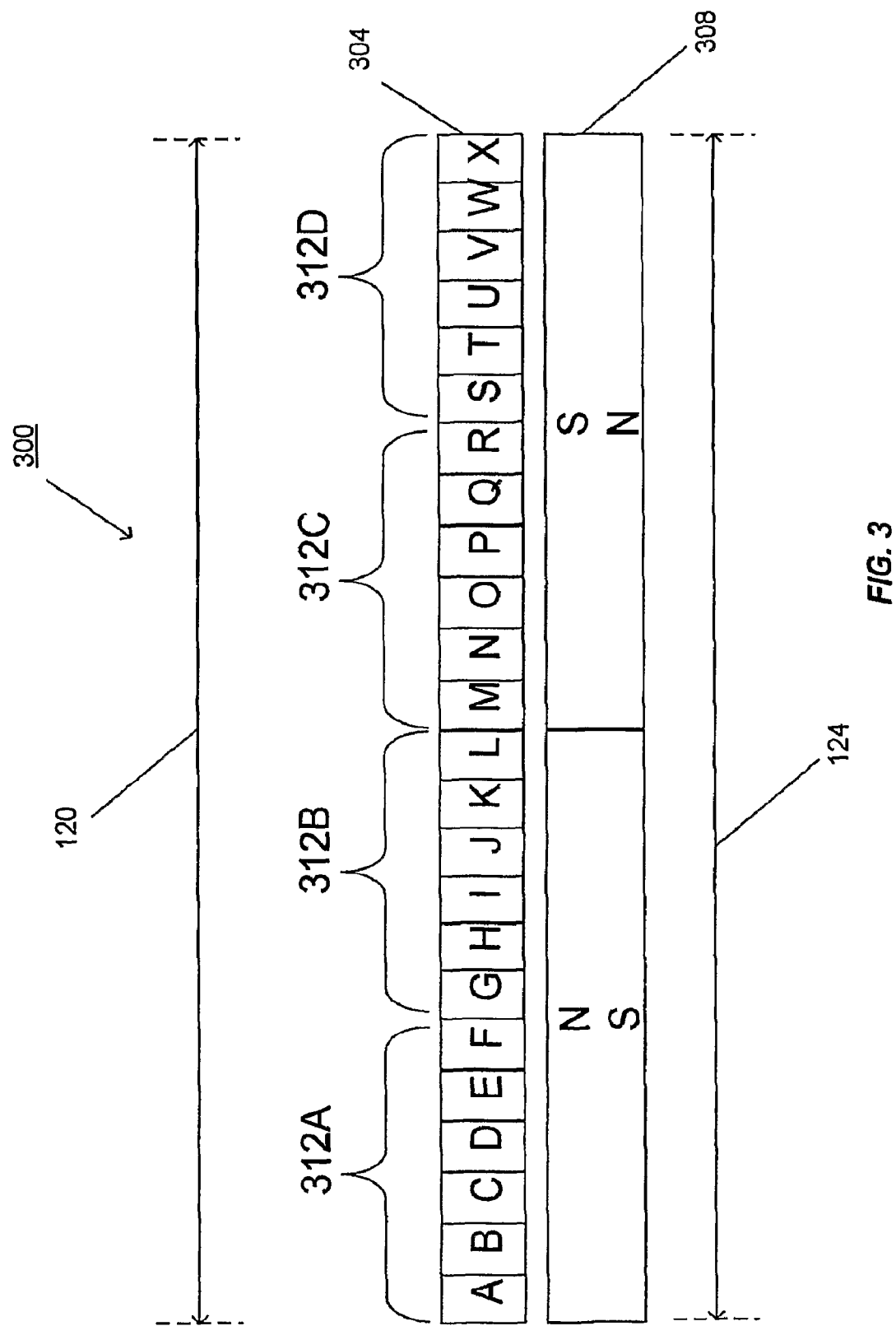
FIG. 3 is a schematic view of a third sensing apparatus.

FIG. 3 shows a schematic view of a third sensing apparatus 300 having a string of twenty-four sensors 304 and a properly matched multi-pole magnet 308. Although the compensation module 128 and the output module 140 are not shown in FIG. 3, the sensing apparatus 300 also includes the compensation module 128, the output module 140, or similar modules. Particularly, FIG. 3 shows that the magnet length 124 and the sensor length 120 match properly. After the string of sensors 304 have generated respective outputs, the compensation module 128 divides the sensors 304 into a number of groups as described, and adjusts or compensates the outputs of the sensors 304 of each group with a respective gain factor. However, since the magnet length 124 and the sensor length 120 match properly, the gain factors of the groups have a value of unity. That is, the outputs of the sensors 304 are compensated with a unity gain. The compensation module 128 then sends the compensated outputs of the sensors 304 to the output module 140 that groups the sensors 304 into four equal-length compensated sections 312A, 312B, 312C, 312D. The output module 140 then generates compensated output signals in the form of sine and cosine waves by adding and subtracting outputs of different sections 312 of the string sensor 304. The first compensated section 312A includes the sensors 304A, 304B, 304C, 304D, 304E, 304F, whereas the second compensated section 312B includes the sensors 304G, 304H, 304I, 304J, 304K, 304L. Similarly, the third compensated section 312C includes the sensors 304M, 304N, 304O, 304P, 304Q, 304R, whereas the fourth compensated section 312D includes the sensors 304S, 304T, 304U, 304V, 304W, 304X. The output module 140 then subtracts a sum of the outputs of the third and fourth compensated sections 312C, 312D from a sum of the outputs of the first and second compensated sections 312A, 312B in a known manner to obtain a sine signal. Similarly, the output module 140 subtracts a sum of the outputs of the second and third compensated sections 312B, 312C from a sum of the outputs of the first and fourth compensated sections 312A, 312D in a known manner to obtain a cosine signal.

Figure 4:
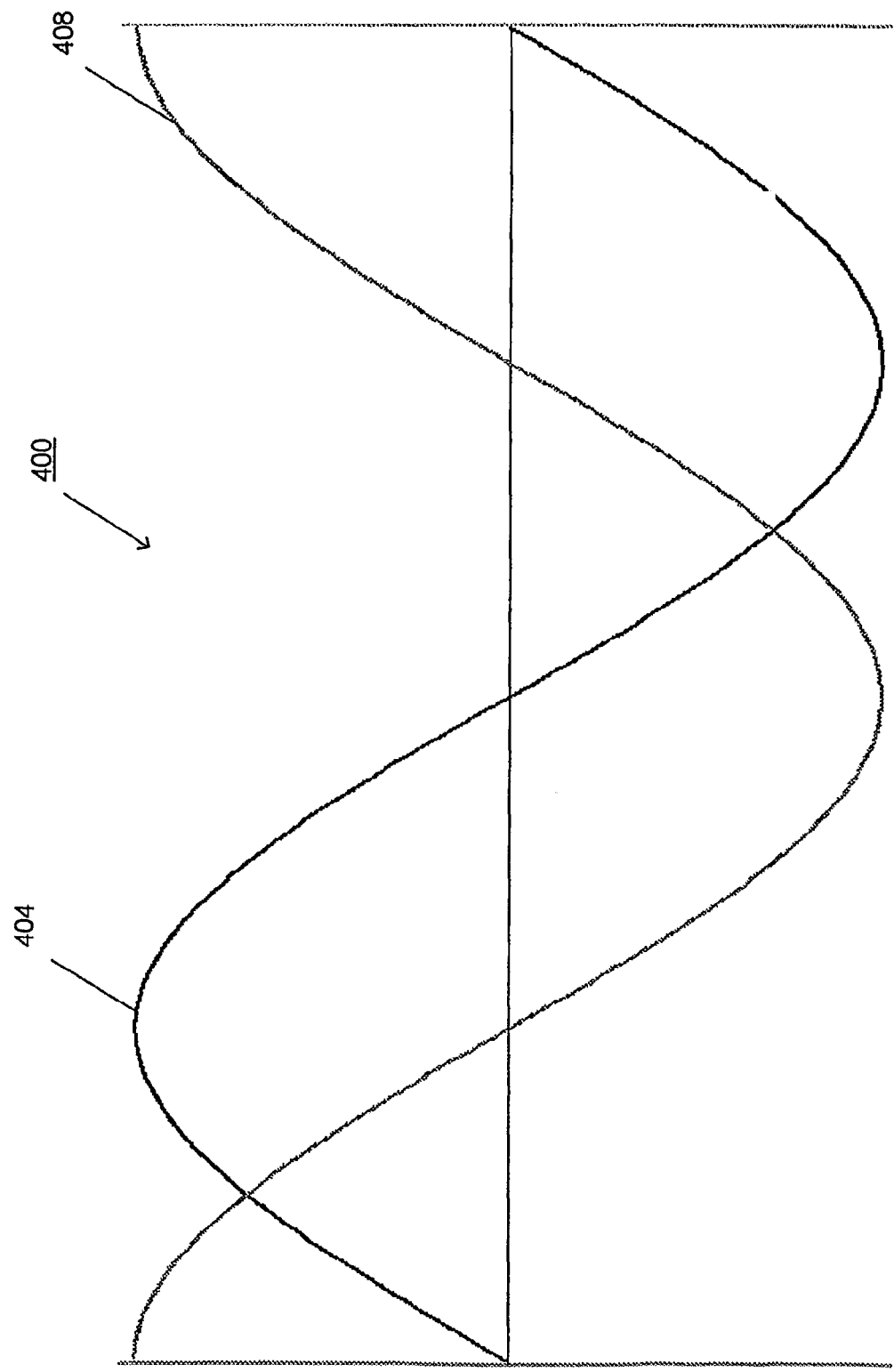
FIG. 4 is an exemplary signal output plot of the third sensing apparatus of FIG. 3.

FIG. 4 shows an exemplary compensated signal output plot 400 of the third sensing apparatus 300 of FIG. 3. The signal plot 400 shows that outputs 404, 408 of the sensors 304 have essentially equal amplitudes, and in the form of sine and cosine waveforms.

Figure 5:
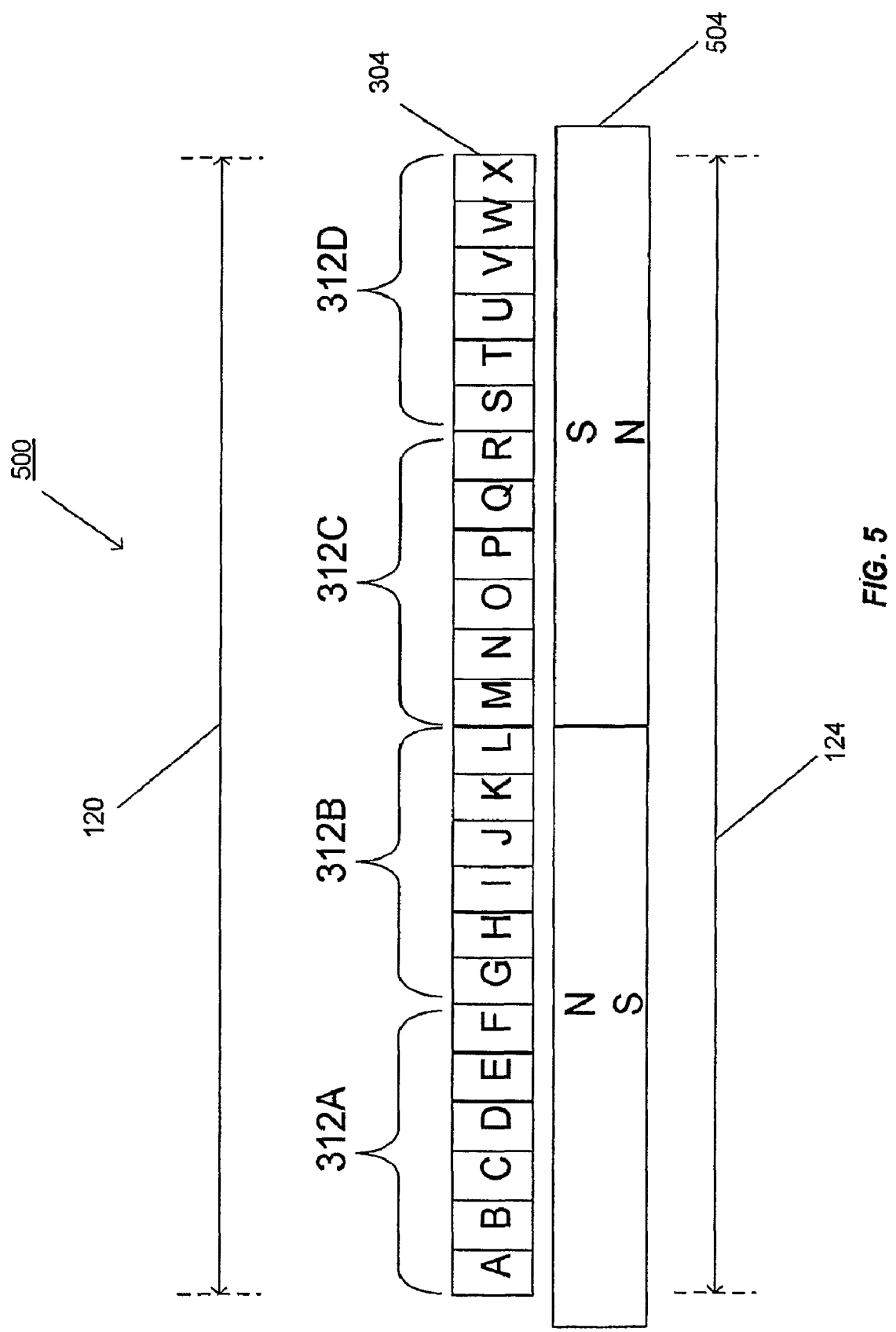
FIG. 5 is a schematic view of a fourth sensing apparatus.

FIG. 5 is a schematic view of a fourth sensing apparatus 500 having a string of twenty-four sensors 304 and an improperly matched multi-pole magnet 504 in a differential configuration. That is, the magnet length 124 and the sensor length 120 are different. After the string of sensors 304 have generated respective outputs as described, the compensation module 128 divides the sensors 304 into a number of groups as described, and adjusts or compensates the outputs of the sensors 304 of each group with a respective gain factor. The compensation module 128 then sends the compensated outputs of the sensors 304 to the output module 140 that groups the sensors 304 into four equal-length compensated sections 312A, 312B, 312C, 312D. The output module 140 then generates compensated output signals in the form of sine and cosine waves by adding and subtracting outputs of different sections 312 of the string sensor 304 as described.

Figure 6:
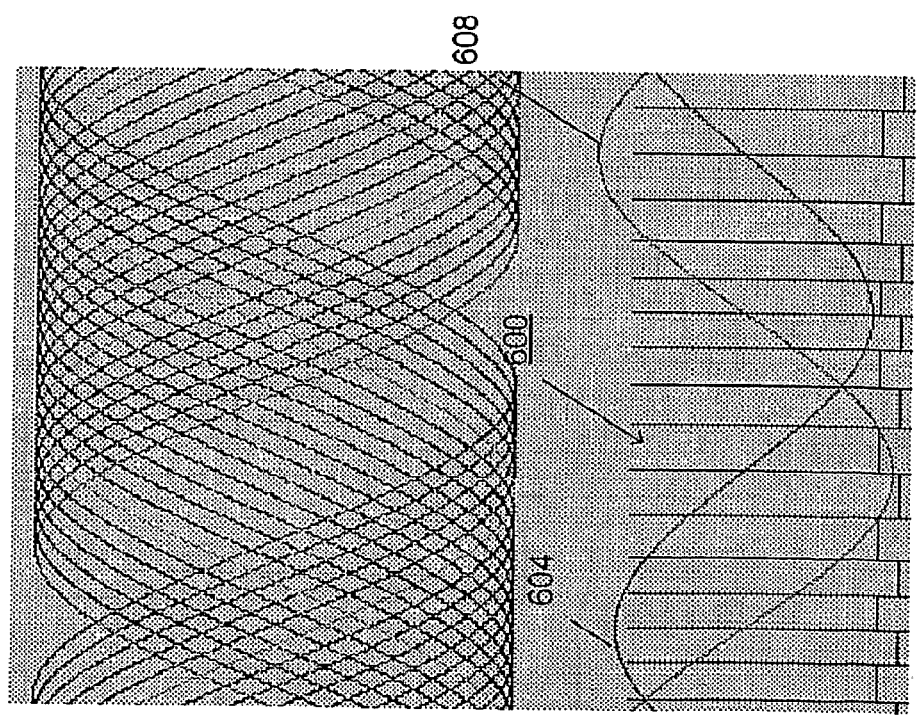
FIG. 6 is an exemplary output plot of the fourth sensing apparatus of FIG. 5 without compensation.

FIG. 6 shows an exemplary output plot 600 of the sensing apparatus 500 of FIG. 5 with the gain factors being forced or preset to unity in the compensation module 128. The signal plot 600 shows that outputs 604, 608 of the sensors 504 have unequal amplitudes.

Figure 7:
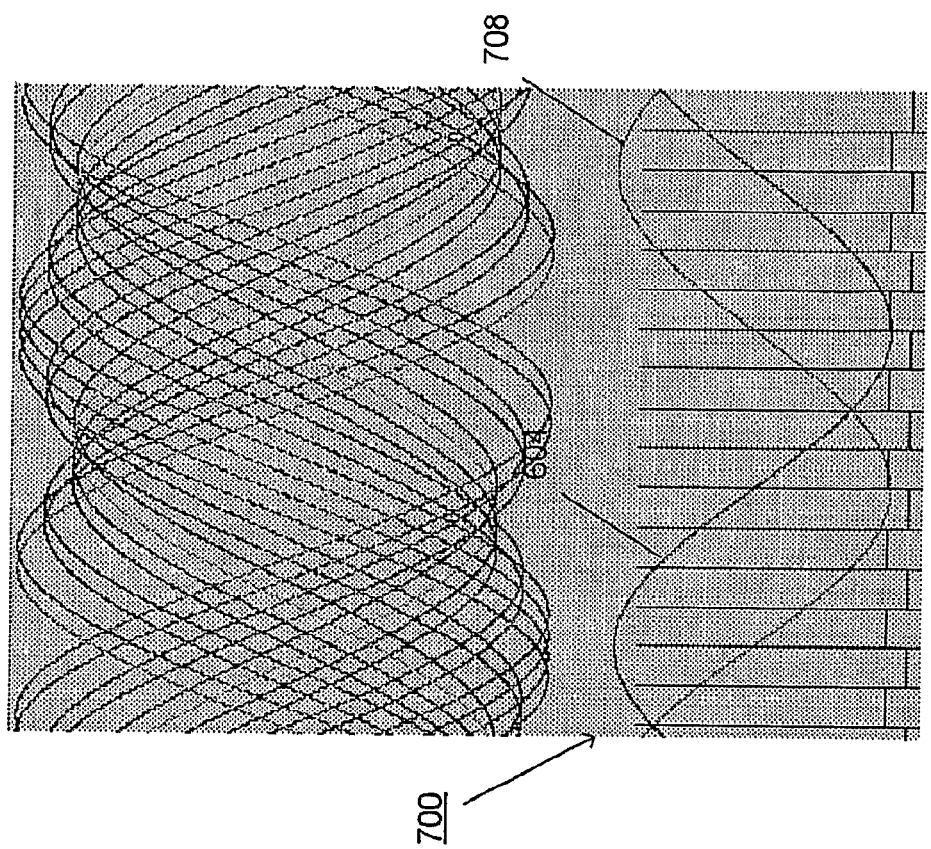
FIG. 7 is an exemplary output plot of the fourth sensing apparatus of FIG. 5 with compensation.

FIG. 7 shows an exemplary output plot 700 with the gain factors being determined by the compensation module 128. The signal plot 700 also shows that outputs 704, 708 of the sensors 504 are in the form of sine and cosine signals that have equal amplitudes.

Figure 8:
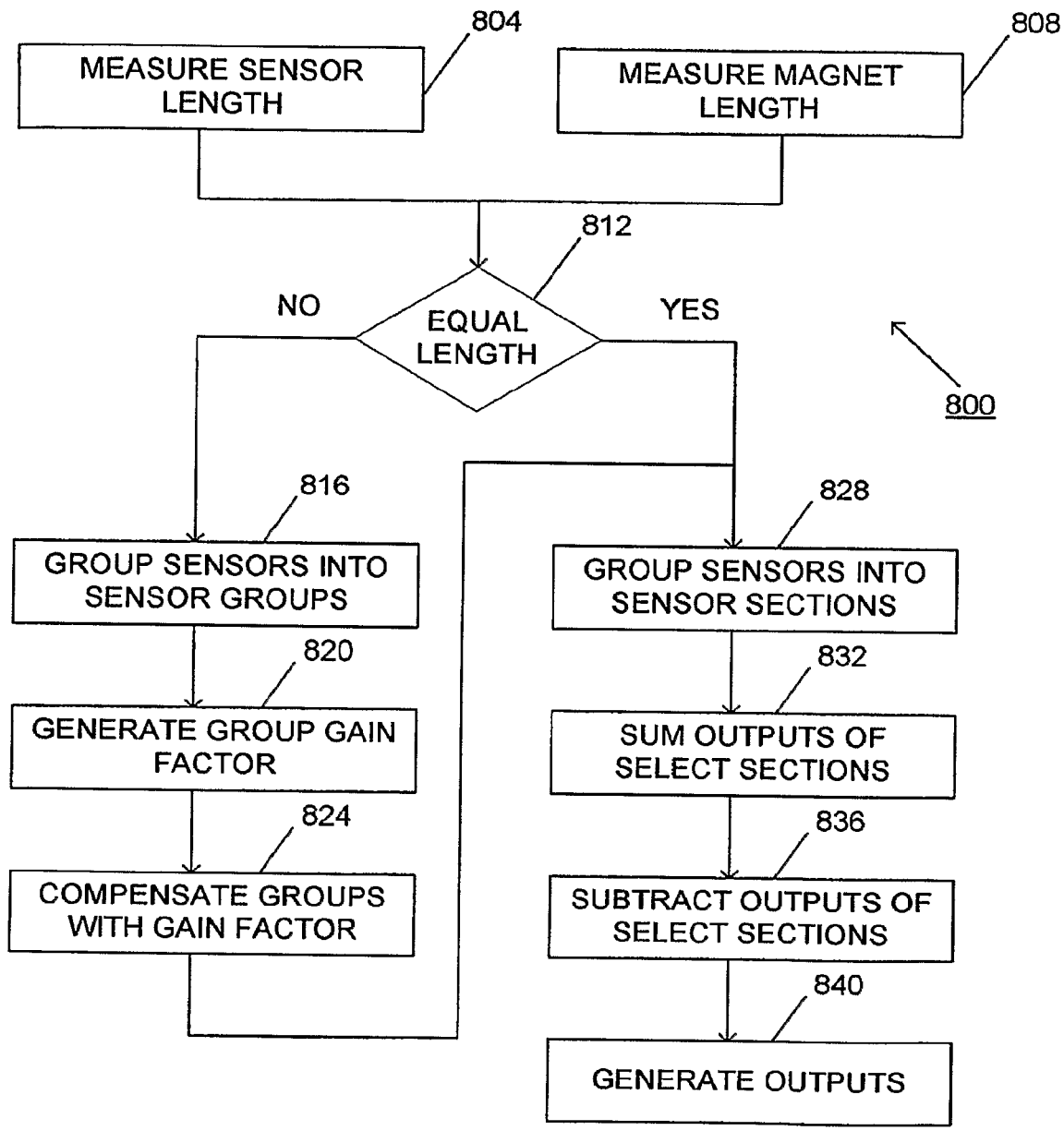
FIG. 8 is a flow chart that depicts processing carried out in embodiments of the invention.

FIG. 8 includes a flow chart 800 that further illustrates processes that occur in some embodiments herein. Lengths of a string of sensors and a multi-pole magnet are measured at blocks 804, 808, respectively. If the lengths are different as determined in block 812, the sensors are grouped into a plurality of sensor groups at block 816. A gain factor or a weight for each of the sensor groups is determined or generated at block 820 as described with respect to FIGS. 1 and 2. Outputs of the sensors are adjusted or compensated with the respective gain factor at block 824. If it is determined at block 812 that the lengths are equal, or after the outputs of the sensors have been compensated at block 824, the sensors are regrouped into a plurality of sensor sections. The outputs of the sections are then summed and subtracted from each other at blocks 832, 836, respectively, as described with respect to FIG. 5. Outputs in the form of sine and cosine signals are then generated at block 840.

Embodiments herein can be used to detect steering wheel position or wheel position, and can be used in other critical angle position sensing applications, robotic applications, packaging applications, and manufacturing assembly applications. Furthermore, embodiments herein can also be used in other equipment, such as agricultural equipment, earth moving equipment, off-road equipment, forklifts, and on-road vehicles.

Figure 9:
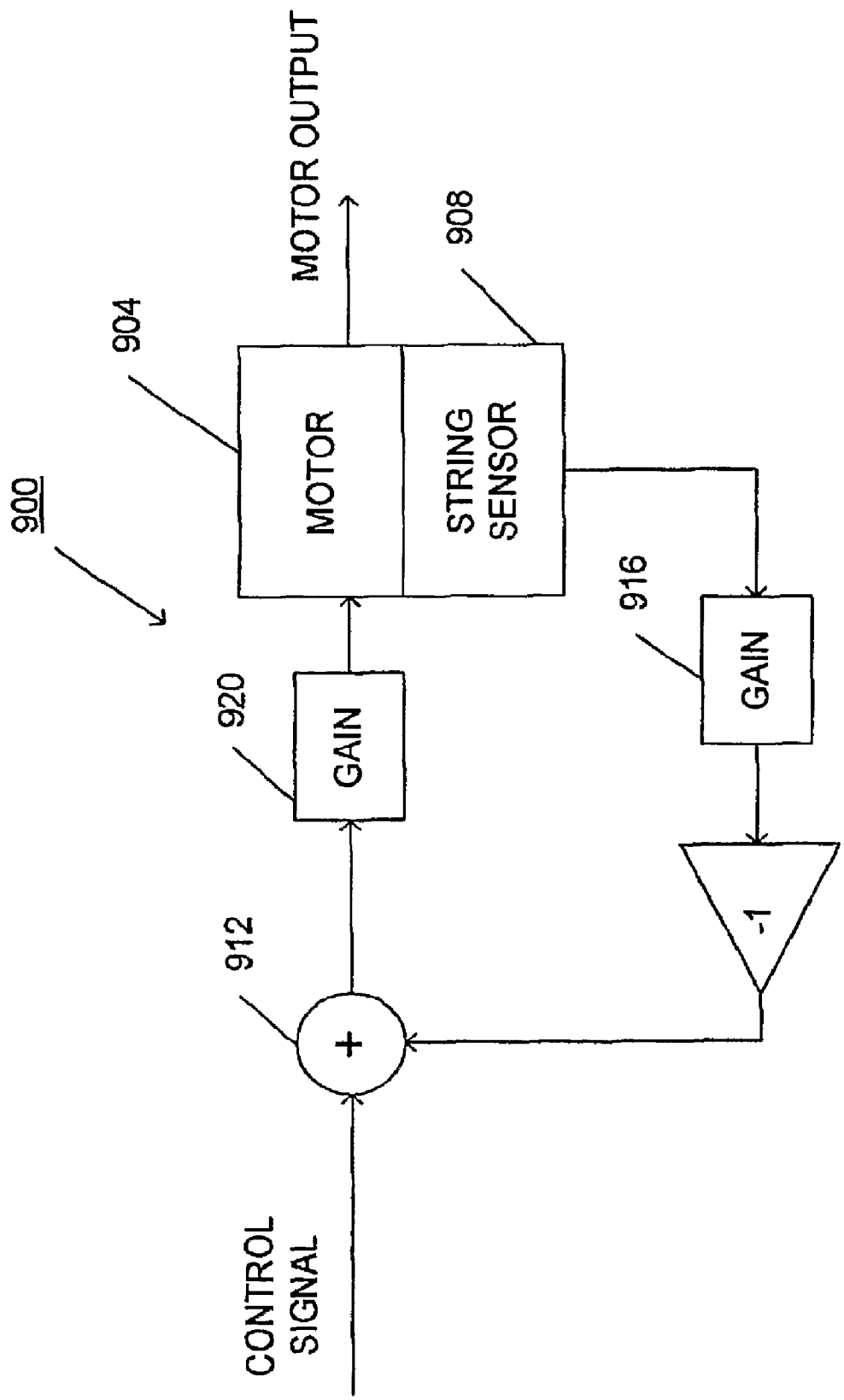
FIG. 9 is a negative feedback motor control system with a sensing apparatus of the invention.

FIG. 9 shows a general motor control system 900 that incorporates the sensing assembly 100, 200, or 300 using a negative feedback. The control system 900 includes a motor 904 and a motor sensor, string encoder, or a string sensor 908 (such as the sensing assembly 100) that monitors speed and/or directional information of the motor 904. After receiving external control signals from a controller or a processor (not shown), the control system 900 determines at a summing node 912 a difference between the control signals and a plurality of feedback signals determined using information from the string sensor 908. Particularly, the feedback signals of the string encoder 908 are adjusted at a first gain module 916 to obtain a plurality of adjusted outputs. After the control system 900 has determined the difference between the control signals and the adjusted signals, the control system 900 modifies the difference with a second gain module 920 to obtain a modified difference. The control system 900 subsequently feeds the modified difference to the motor 904 such that the control system 900 can adjust operations of the motor 904.

Thus, the invention provides, among other things, an angle sensing apparatus.

The invention claimed is:

1. A sensing assembly adapted to be spaced apart from a magnet having a magnet length, the sensing assembly comprising:
    a string of magnetic sensors having a string length, the magnetic sensors grouped into a plurality of magnetic sensor groups, each of the magnetic sensors configured to generate a respective intermediate signal based on the magnet; and
    a compensation module configured to assign respective gains to the respective magnetic sensor groups based on a difference between the magnet length and the string length, and to apply the respective gains to the respective intermediate signals of the respective magnetic sensor groups to generate respective adjusted signals.

2. The sensing assembly of claim 1, further comprising an output module configured to sum the respective adjusted signals based on the magnetic sensor groups to generate a plurality of sine and cosine signals.

3. The sensing assembly of claim 1, wherein the magnet comprises a plurality of poles, and wherein the magnetic sensors are arranged relatively symmetrically with respect to the poles.

4. The sensing assembly of claim 3, wherein the string of sensors are grouped into an inner group configured to include a plurality of sensors closest to the poles, an outer group configured to include a plurality of sensors farthest from the poles, and an intermediate group configured to include a plurality of sensors between the inner group and the outer group.

5. The sensing assembly of claim 4, wherein the respective intermediate signals of the inner group are amplified by a gain value when the magnet length is less than the string length, the respective intermediate signals of the outer group are attenuated with the gain value when the magnet length is less than the string length, the respective intermediate signals of the inner group are attenuated by a gain value when the magnet length is greater than the string length, and the respective intermediate signals of the outer group are amplified with the gain value when the magnet length is greater than the string length.

6. The sensing assembly of claim 1, wherein the compensation module comprises a memory configured to store the respective gains.

7. The sensing assembly of claim 1, wherein the groups of magnetic sensors have equal lengths.

8. A method of compensating for a dimensional difference between a magnet and a sensor string having a plurality of sensors, the method comprising:
    assigning a reference to the magnet;
    determining a respective distance between each of the sensors and the reference;
    assigning a respective weight to each of the sensors based on the respective distance; and
    applying the assigned respective weights to respective outputs of the sensors.

9. The method of claim 8, wherein applying the assigned respective weights to respective outputs results in a plurality of adjusted signals, the method further comprising summing the plurality of adjusted signals to generate a plurality of sine and cosine signals.

10. The method of claim 8, wherein the magnet comprises a plurality of poles, and wherein assigning a reference to the magnet comprises assigning a reference relatively symmetrically with respect to the poles.

11. The method of claim 10, further comprising determining a difference between a length of the sensors and a length of the magnet.

12. The method of claim 11, wherein assigning a respective weight to each of the sensors based on the respective distance comprises:
    assigning an amplification factor to a plurality of respective sensors having relatively shorter distances when the magnet length is less than the string length;
    assigning an attenuation factor to a plurality of respective sensors having relatively greater distances when the magnet length is less than the string length;
    assigning an attenuation factor to a plurality of respective sensors having relatively shorter distances when the magnet length is greater than the string length; and
    assigning an amplification factor to a plurality of respective sensors having relatively greater distances when the magnet length is greater than the string length.

13. A method of compensating for a dimensional difference between a magnet and an adjacent sensor string having a plurality of sensors, the method comprising:
    measuring the dimensional difference between the magnet and the sensor string;
    grouping the sensors into a plurality of sensor groups;
    generating a respective intermediate signal at each of the sensors based on the magnet; and
    applying a gain to the respective intermediate signals based on the dimensional difference and the groups.

14. The method of claim 13, wherein applying a gain to the respective intermediate signals results in a plurality of adjusted signals, the method further comprising summing the plurality of adjusted signals to generate a plurality of sine and cosine signals.

15. The method of claim 13, wherein the magnet comprises a plurality of poles, the method further comprising arranging the magnetic sensors relatively symmetrically with respect to the poles.

16. The method of claim 15, wherein grouping the sensors into a plurality of sensor groups comprises:
    grouping into an inner group the plurality of sensors closest to the poles; and
    grouping into an outer group the plurality of sensors farthest from the poles.

17. The method of claim 16, wherein the dimensional difference comprises a length difference, wherein applying a gain to the respective intermediate signals based on the dimensional difference and the groups comprises:
    assigning an amplification factor to the inner group when the magnet length is less than the string length;
    assigning an attenuation factor to the outer group when the magnet length is less than the string length;
    assigning an amplification factor to the outer group when the magnet length is greater than the string length; and
    assigning an attenuation factor to the inner group when the magnet length is greater than the string length.

18. The method of claim 13, wherein the sensor groups comprise an equal number of sensors.

19. The method of claim 16, wherein the dimensional difference comprises a length difference.

20. The method of claim 19, wherein the magnet and the sensor string have different lengths.

21. The method of claim 13, wherein each sensor group includes a plurality of sensors.

* * * * *